United States Patent
Liebig et al.

(10) Patent No.: US 11,815,583 B2
(45) Date of Patent: Nov. 14, 2023

(54) ECHO-SPACING SHUFFLING FOR ECHO-PLANAR-IMAGING

(71) Applicants: Siemens Healthcare GmbH, Erlangen (DE); University of Glasgow, Glasgow (GB)

(72) Inventors: Patrick Liebig, Erlangen (DE); David Andrew Porter, Regensburg (DE); Robin Heidemann, Litzendorf (DE)

(73) Assignees: Siemens Healthcare GmbH, Erlangen (DE); University of Glasgow, Glasgow (GB)

( * ) Notice: Subject to any disclaimer, the term of this patent is extended or adjusted under 35 U.S.C. 154(b) by 0 days.

(21) Appl. No.: 17/848,529

(22) Filed: Jun. 24, 2022

(65) Prior Publication Data
US 2023/0003820 A1    Jan. 5, 2023

(30) Foreign Application Priority Data
Jun. 30, 2021    (EP) .................................. 21182848

(51) Int. Cl.
*G01R 33/561* (2006.01)
*G01R 33/48* (2006.01)

(52) U.S. Cl.
CPC ..... *G01R 33/5616* (2013.01); *G01R 33/4824* (2013.01); *G01R 33/5611* (2013.01)

(58) Field of Classification Search
CPC ............ G01R 33/4824; G01R 33/5611; G01R 33/5616
See application file for complete search history.

(56) References Cited

U.S. PATENT DOCUMENTS

| | | | | |
|---|---|---|---|---|
| 10,502,804 | B2* | 12/2019 | Park | G01R 33/56527 |
| 11,231,476 | B2* | 1/2022 | Garwood | G01R 33/3635 |
| 2017/0307717 | A1* | 10/2017 | Geraghty | G01R 33/56563 |
| 2020/0225303 | A1 | 7/2020 | Heidemann et al. | |

OTHER PUBLICATIONS

Heidemann R. et al.: "Fast method for 1D non-cartesian parallel imaging using GRAPPA" in: Magnetic Resonance in Medicine, vol. 57, Jun. 2007, pp. 1037-1046, https://doi.org/10.1002/mrm.21227.

(Continued)

*Primary Examiner* — Gregory H Curran
(74) *Attorney, Agent, or Firm* — Banner & Witcoff Ltd.

(57) ABSTRACT

The disclosure is directed to an Echo-Planar-Imaging (EPI) magnetic resonance imaging techniques combined with a variable-density undersampling scheme. The technique comprises generating an RF pulse, applying a switched frequency-encoding read out gradient in a variable time interval, and applying simultaneously an intermittently blipped low-magnitude phase-encoding gradient with a variable value of an integral of the phase-encoding gradient. The aforementioned steps are carried out such that the k-space is at least partially undersampled and the time interval of one read out gradient is varied depending on the integral of the phase encoding gradient, such that a ratio between the variable time interval of the read out gradient and the integral of the corresponding phase encoding gradient is kept above or at a predetermined constant value, which is related to a predetermined criteria of image quality.

11 Claims, 4 Drawing Sheets

(56) References Cited

OTHER PUBLICATIONS

Griswold, Mark A. et al.: Generalized Autocalibrating Partially Parallel Acquisitions (GRAPPA); in: Magnetic Resonance in Medicine; vol. 47; pp. 1202-1210; 2002; XP-002369548; DOI: 10.1002/MRM.10171; 2002.

Kasper, Lars et al: "Matched-filter acquisition for BOLD fMRI"; Neuroimage; Elsevier; Amsterdam; pp. 145-160; XP029047057; ISSN: 1053-8119; DOI: 10.1016/J.NEUROIMAGE.2014.05.024; 2014.

Liebig, Patrick Alexander et al: "A new approach to accelerate readout segmented EPI with compressed sensing"; Magnetic Resonance In Medicine; vol. 84; No. 1; pp. 321-326; XP055861031; ISSN: 0740-3194; DOI: 10.1002/mrm.28116; 2019.

* cited by examiner

ECHO-SPACING SHUFFLING FOR ECHO-PLANAR-IMAGING

CROSS-REFERENCE TO RELATED APPLICATIONS

The present application claims the benefit of the filing date of Europe patent application no. EP 21182848.8, filed on Jun. 30, 2021, the contents of which are incorporated herein by reference in their entirety.

TECHNICAL FIELD

The disclosure relates to an Echo-Planar-Imaging (EPI) magnetic resonance imaging method combined with a variable-density undersampling scheme. Further, the disclosure relates to an MR control sequence determination device and an MR imaging system.

BACKGROUND

With the help of modern imaging methods, two- or three-dimensional image data are often generated that can be used to visualize a patient to be imaged, for example a person or an animal, and also for other applications. A special type of medical imaging is implemented using Magnet Resonance Imaging (MRI).

Magnetic resonance imaging is a medical imaging technique that provides diagnostically relevant information of biological tissue. Its diagnostic relevance originates from the informative power and versatility of this imaging modality, which offers differentiated and precise structure information in a non-invasive fashion. Magnetic resonance imaging is based on the controlled manipulation of nuclear spins inside a patient's body and subsequent detection of the nuclear spin response. The space-dependent encoding of the spin response allows for a reconstruction of the patient's structural composition and functional constitution for the radiologist to perform diagnostic reading.

In a magnetic resonance system, the body to be examined is usually exposed to a relatively high basic magnetic field, for example of 1.5 Tesla, 3 Tesla or 7 Tesla, with the aid of a basic field magnet system. After applying the basic magnetic field, nuclei in the examination object align themselves with a non-vanishing nuclear magnetic dipole moment, often also called spin, along the basic field. This collective behavior of the spin system is described by the macroscopic "magnetization". The macroscopic magnetization is the vector sum of all microscopic magnetic moments in the object at a certain location. In addition to the basic field, a gradient system is used to apply a magnetic field gradient by means of which the magnetic resonance frequency (Larmor frequency) is determined at the respective location.

Radio-frequency excitation signals (referred to interchangeably herein as RF or high-frequency (HF) pulses) are then transmitted via a high frequency transmission system using suitable antenna devices, which should lead to that the nuclear spins of certain nuclei excited by this high-frequency field (i.e. at the Larmor frequency present at the respective location) around a defined area Flip angles are tilted relative to the magnetic field lines of the basic magnetic field. If such an RF pulse acts on spins that are already excited, they can be turned over into a different angular position or even folded back into an initial state parallel to the basic magnetic field. During the relaxation of the excited nuclear spins, high-frequency signals, so-called magnetic resonance signals, are emitted resonantly, which are received by means of suitable receiving antennas (also called magnetic resonance coils or receiving coils), then demodulated and digitized and then processed further as so-called "raw data". The acquisition of the magnetic resonance signals takes place in the spatial frequency space, the so-called "k-space", wherein during a measurement, for example of a slice, the k-space is traversed over time along a "gradient trajectory" (also called "k-space trajectory") defined by the switching of the gradient pulses. In addition, the RF pulses must be sent out at a suitable time. From the raw data acquired in this way, after further processing steps, which as a rule also depend on the acquisition method, the desired image data can finally be reconstructed by means of a two-dimensional Fourier transformation.

Alternatively, three-dimensional volumes can now also be excited and read out in a defined manner, the raw data in turn being sorted into a three-dimensional k-space after further processing steps. A three-dimensional image data volume can then be reconstructed using a three-dimensional Fourier transformation.

SUMMARY

Usually, certain predetermined pulse sequences are used to control a magnetic resonance tomography system during the measurement, i.e. sequences of defined RF pulses and gradient pulses in different directions and readout windows, during which the receiving antennas are switched to receive and the magnetic resonance signals are received and processed. With the help of a so-called measurement protocol, these sequences are parameterized in advance for a desired examination, for example a specific contrast of the calculated images. The measurement protocol can also contain further control data for the measurement. There are a number of magnetic resonance sequence techniques according to which pulse sequences can be constructed. One of the great challenges facing future developments in magnetic resonance imaging (MR imaging) is an acceleration of magnetic resonance sequence techniques without extensive compromises in terms of resolution, contrast and susceptibility to artifacts.

Current clinical MR imaging is based almost exclusively on so-called Cartesian or right-angled (rectilinear) imaging, in which the scanned k-space points (i.e. the scanning points in k-space, where raw data are recorded) lie on the grid points of a rectangular grid or pattern.

In doing so, so-called parallel imaging methods have succeeded in significantly accelerating clinical MR imaging. In the case of a special variant of parallel MR imaging, called compressed sensing, the data acquisition is shortened in that some of the lines of the grid that are actually necessary for reconstructing an image free of convolution are not acquired in k-space. These missing lines are later substituted during the image reconstruction in k-space or the convolution artifacts resulting from the undersampling are removed in the image space. A prerequisite for being able to use the parallel imaging methods is the reception of the high-frequency signals with several receiving coils (antennas), whereby the spatial sensitivity of the individual receiving coils must be known. The spatial sensitivity of the receiving coils is calculated with the help of so-called coil calibration data. The coil calibration data must usually be sufficiently sampled. Since the sensitivities generally vary slowly in space, it is usually sufficient, if the coil calibration data have a low spatial resolution. Typically, the coil calibration data must be remeasured for each patient.

One of the most important parallel imaging methods is the so-called GRAPPA method, as it is described e.g. in the article "Generalized Autocalibrating Partially Parallel Acquisitions (GRAPPA)" by Marc Griswold et al. in Magnetic Resonance in Medicine 47, 2002, pp. 1202-1210.

For parallel imaging in general, or Compressed Sensing in particular, a variable density undersampling scheme is beneficial to image quality in accelerated MRI. With this approach, the central part of k-space is sampled more densely, whereas more lines or points in the periphery are left out. There are potential benefits to combining Compressed Sensing with rapid acquisition techniques based on Echo-Planar-Imaging, abbreviated as EPI. However, standard EPI is not compatible with variable-density undersampling because it disrupts the phase evolution of an off-resonant signal, leading to image artifacts.

Spatial encoding with EPI is achieved by sampling signals during rapid gradient switching, which generates a zig-zag trajectory in k-space. This trajectory has a discrepancy between the readout direction (kx), abbreviated as RO-direction and the phase-encoding direction (ky), abbreviated as PE-direction. Along the RO-direction, k-space is sampled quickly using high gradient strengths, whereas along the PE-direction, small gradient blips are applied at regular intervals corresponding to a low sampling rate in k-space. At tissue interfaces, for example at the boundary between water and air in the frontal cortex in the human brain, strong differences in susceptibility can arise. This has the effect of contributing background magnetic-field gradients, which can be comparable in magnitude to the blipped PE gradients. This perturbs the k-space trajectory for signals emanating from this region of tissue, which leads to spatial distortion in the final image.

To reduce these distortions, parallel imaging can be applied, which uses regular undersampling to shorten the echo train and thereby the time taken to traverse k-space in the PE direction. This effectively increases the amplitude of the blipped PE gradients relative to the background gradients and reduces their effect. Similarly, multi-shot, segmented-k-space techniques can also be used to reduce the length of the echo train, albeit at the cost of an overall increase in scan time.

There is a problem that the EPI methods described above rely on a regular sampling in k-space to preserve image quality, and this is incompatible with the compressed sensing (CS) requirement for variable-density undersampling. This is because the variable sampling would result in uneven steps in k-space that do not match the constant phase evolution of off-resonant signals, a particular issue in regions with background magnetic-field gradients. In effect, this produces spatial distortion that is a function of spatial frequency, causing a smearing and loss of detail in the final image.

One possible way is to always have the minimum amplitude of the blipped PE gradient above a certain threshold so that no distortions appear at all during the acquisition. Above that threshold, then a variable density undersampling pattern can be implemented. However, due to the need for a lower threshold, the length of the echo train cannot be longer than about 11 echoes. That reduces the overall acquisition speed and does thereby not make this method applicable to applications where imaging speed is crucial, like functional MRI (fMRI) or diffusion-weighted imaging (DWI).

There is therefore the problem of developing a fast MR imaging method with sufficient image quality.

This object is achieved by an EPI magnetic resonance imaging method combined with a variable-density undersampling scheme according to the embodiments as described herein, including the claims.

The EPI magnetic resonance imaging method combined with a variable-density undersampling scheme according to the disclosure comprises the steps of generating an RF-pulse, applying a switched frequency-encoding read out gradient in a variable time interval, and applying simultaneously an intermittently blipped low-magnitude phase-encoding gradient with a variable value of an integral of the phase-encoding gradient. A variable time interval means that the time interval of at least two of the read out gradients played out, comprises a different value. A variable value of an integral of a phase-encoding gradient means that the values of the integrals of at least two of the phase-encoding gradients played out are different than each other. The aforementioned steps are carried out such that the k-space is at least partially undersampled and the time interval of one read out gradient is varied depending on a value of an integral of the phase encoding gradient such that a ratio between the variable time interval of the read out gradient and the value of the integral of the corresponding phase encoding gradient is kept above or at a predetermined constant value, which is related to a predetermined criteria of image quality. The time interval of one read out gradient is also named echo spacing. The value of the integral of the phase encoding gradient is directly proportional to the local undersampling factor in k-space. The ratio between the variable time interval of the read out gradient and the value of an integral of the corresponding phase encoding gradient is named effective echo spacing. The effective echo spacing can also be defined as the ratio between the echo spacing of a read out gradient and an undersampling factor. The variation of echo spacing corresponding to the undersampling factor is also named as echo-spacing shuffling.

Advantageously, the method according to the disclosure allows a combination of an undersampling scheme with an EPI acquisition scheme, which acquires large segments of k-space at each excitation using a long echo train. Such a combination provides a further reduction in scan time. Since the effective echo-spacing is maintained over a predetermined value, image quality is maintained at a predetermined level, although the undersampling scheme changes throughout the k-space. Hence, it is possible to use an arbitrary variable-density undersampling scheme combined with an EPI pulse sequence without the introduction of image artifacts of a higher amount than is predetermined in advance.

The MR control sequence determination device according to the disclosure comprises an RF-pulse generating unit for playing out (i.e. transmitting) an RF-pulse, a gradient generating unit for generating a switched frequency-encoding read out gradient in a variable time interval and simultaneously generating an intermittently blipped low-magnitude phase-encoding gradient with a variable amplitude or variable value of an integral of the phase-encoding gradient. The gradient generating unit is designed to play out (i.e. transmit) the gradients such that the k-space is at least partially undersampled and the time interval of one read out gradient is varied depending on the value of the integral of the phase encoding gradient such that a ratio between the variable time interval of the read out gradient and the value of the integral of the corresponding phase encoding gradient is kept above or at a predetermined constant value, which is related to a predetermined criteria of image quality. The gradient generating unit shares the advantages of the EPI magnetic resonance imaging method according to the disclosure.

The MR imaging system comprises a scan unit and an MR control sequence determination device according to the disclosure. The MR imaging system shares the advantages of the MR control sequence determination device.

Some of the components of the MR control sequence determination device according to the disclosure can be designed for the most part in the form of software components. This applies in particular to parts of the gradient generating unit and the RF-pulse generating unit. In principle, however, some of these components can also be implemented in the form of software-supported hardware, for example FPGAs or the like, e.g. when it comes to particularly fast calculations. Likewise, the required interfaces, for example if it is only a matter of transferring data from other software components, can be designed as software interfaces. However, they can also be designed as hardware-based interfaces that are controlled by suitable software.

A largely software-based implementation has the advantage that computer units or control units of MR imaging systems that have already been used can easily be retrofitted by a software update to work in the manner according to the disclosure. In this respect, the object is also achieved by a corresponding computer program product with a computer program, which can be loaded directly into a memory device of a computer unit or a control unit of an MR imaging system and which includes program sections to carry out all steps to execute the method according to the disclosure when the computer program is executed in the computer unit or control unit of the MR imaging system.

In addition to the computer program, such a computer program product can optionally include additional components such as documentation and/or additional components, including hardware components such as hardware keys (dongles, etc.) for using the software.

A computer-readable medium, for example a memory stick, a hard disk, or any other suitable transportable or permanently installed data carrier, on which program sections of the computer program that can be read in and executed are stored, can be used for transport to the storage device of a computer unit of an MR imaging system and/or for storage on the computer unit of the MR imaging system. The computer unit can, for example, have one or more cooperating microprocessors or similar for this purpose.

Advantageous configurations and developments of the disclosure result from the dependent claims as well as the following description and the figures, in which the independent claims of one claim category can also be developed analogously to the dependent claims of another claim category and their description parts.

In an embodiment of the EPI magnetic resonance imaging method according to the disclosure, the amplitude of the phase-encoding gradient is variable and the time interval of one read out gradient is varied depending on the amplitude of a corresponding phase encoding gradient, such that a ratio between the variable time interval of the read out gradient and the amplitude of the corresponding phase encoding gradient is kept above or at a predetermined constant value, which is related to a predetermined criteria of image quality. In the aforementioned variant, the phase-encoding gradient comprises a shape, wherein the amplitude is proportional to the value of an integral of the phase encoding gradient. That is, for example, the case for a rectangular or triangular shaped phase encoding gradient.

In an embodiment of the EPI magnetic resonance imaging method according to the disclosure, the ratio between the variable time interval of the read out gradient and the value of the integral and/or the amplitude of the corresponding phase encoding gradient is kept throughout the whole sampling of k-space above or at the predetermined constant value. Advantageously, the level of distortion is kept constant throughout k-space to preserve image quality.

In an embodiment of the EPI magnetic resonance imaging method according to the disclosure, the undersampling scheme comprises a variable density scheme, which is used to acquire raw data for a parallel image reconstruction. A combination of parallel imaging with EPI enables to further accelerate an EPI acquisition.

In an embodiment of the EPI magnetic resonance imaging method according to the disclosure, the undersampling scheme comprises a variable density scheme, which is used to acquire raw data for a compressed sensing reconstruction. A combination of CS with EPI also enables to accelerate an EPI acquisition process. Further, such a combination enables to sample an extended area of k-space in a short time, which is very important for time dependent applications like functional magnetic resonance imaging or a diffusion-weighted magnetic resonance imaging method.

BRIEF DESCRIPTION OF THE DRAWINGS/FIGURES

The disclosure is explained in more detail below with reference to the attached figures on the basis of exemplary embodiments. The same components are provided with identical reference numbers in the various figures.

DETAILED DESCRIPTION

Figure 1:
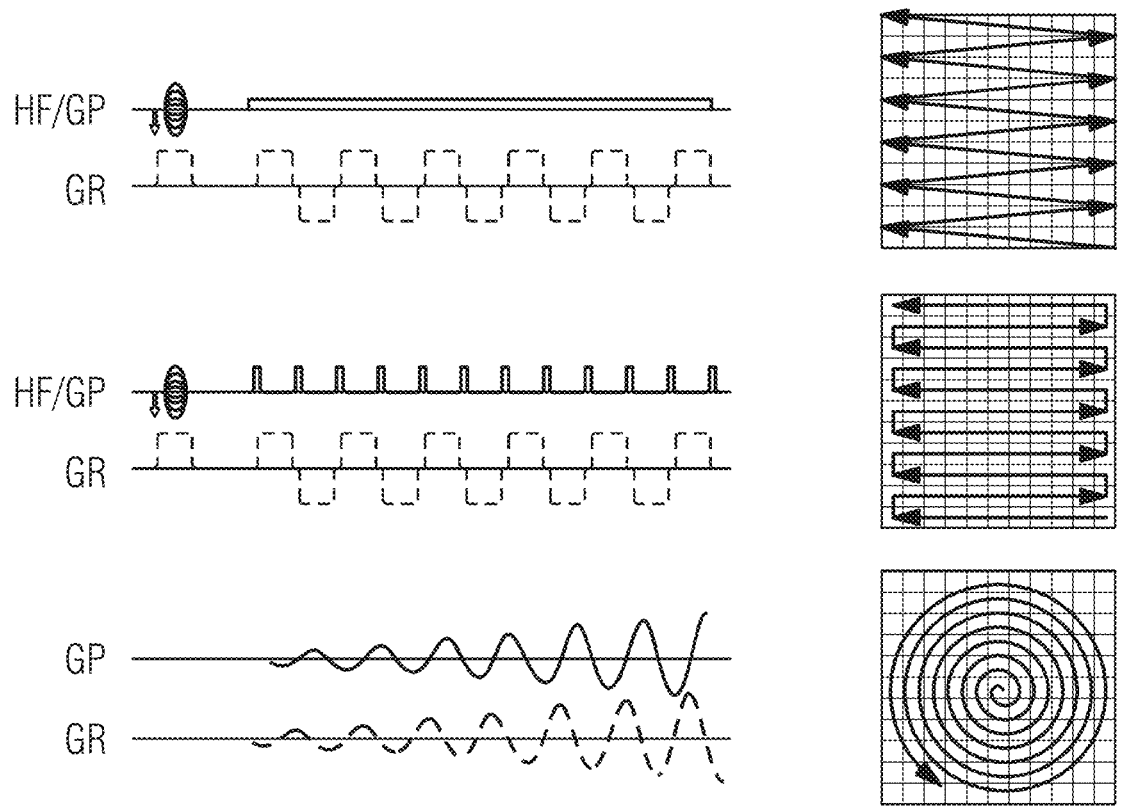
FIG. 1 illustrates example pulse sequence diagrams of different EPI pulse sequences.

FIG. 1 shows three different conventional pulse sequence diagrams and the corresponding k-space trajectories of three different EPI pulse sequences. A first pulse sequence represents an EPI sequence with a continuous phase encoding gradient GP, which is illustrated in the upper part of FIG. 1. The corresponding k-space trajectory at the right side of the pulse sequence diagram shows a linear change of frequency and encoded phase. In contrast, a second pulse sequence diagram, shown in FIG. 1 in the middle position, comprises a pulse sequence comprising so called blipped gradients GP, which have the effect that the chance of frequency and the change of phase is decoupled, which is illustrated in a k-space diagram on the right side of the second pulse sequence diagram. A third pulse sequence diagram shows some alternating phase encoding gradients GP and read out gradients GR, which lead to a spiral shaped trajectory in k-space as illustrated on the right side of the corresponding pulse sequence diagram.

Figure 2:
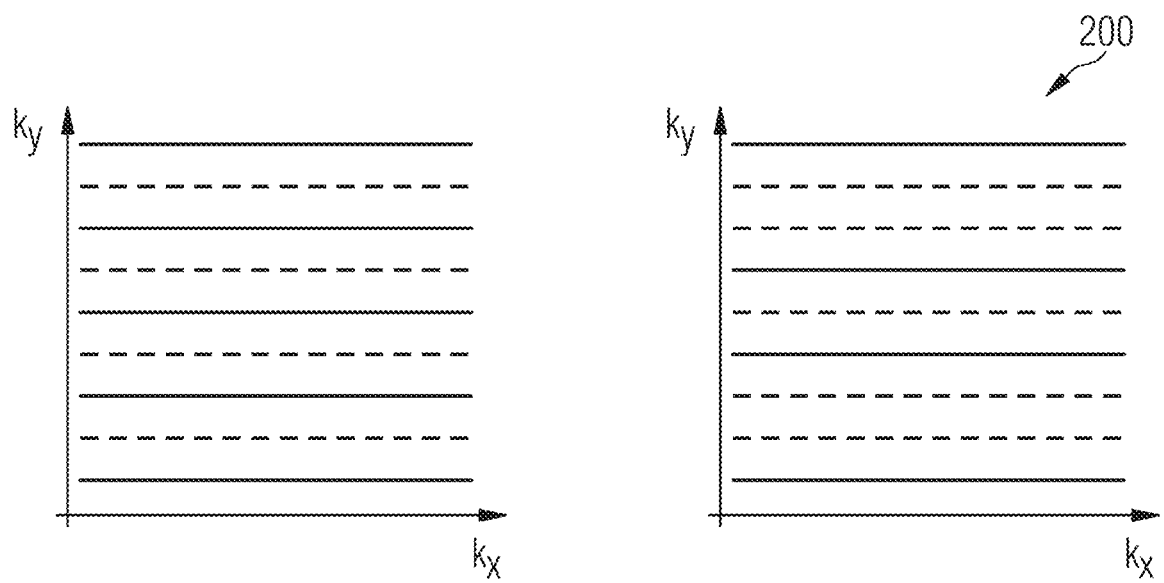
FIG. 2 illustrates example k-space trajectories of a pulse sequence of a blipped phase encoding gradient EPI scheme combined with an undersampled scheme.

FIG. 2 illustrates some k-space trajectories of a pulse sequence of a blipped phase encoding gradient EPI scheme combined with an undersampled scheme. On the left side, a regular undersampled EPI scheme is represented, wherein the dashed lines represent left out (i.e. unsampled) read out trajectory lines and the continuous lines represent sampled trajectory lines of the EPI scheme. The problem of a compressed sensing scheme with regular undersampling is the arising of repeating artifacts, which reduces image quality.

On the right side of FIG. 2 an undersampled EPI scheme with variable undersampling is shown, wherein the number of unsampled read out trajectory lines vary from the number of 2 to the number of 3. The problem of such a variable undersampling is that the variable sampling would result in uneven steps in k-space that do not match the constant phase evolution of off-resonant signals, which is important for regions with background magnetic-field gradients. This effect produces spatial distortion that is a function of spatial frequency, causing a smearing and loss of detail in the final image.

Figure 3:
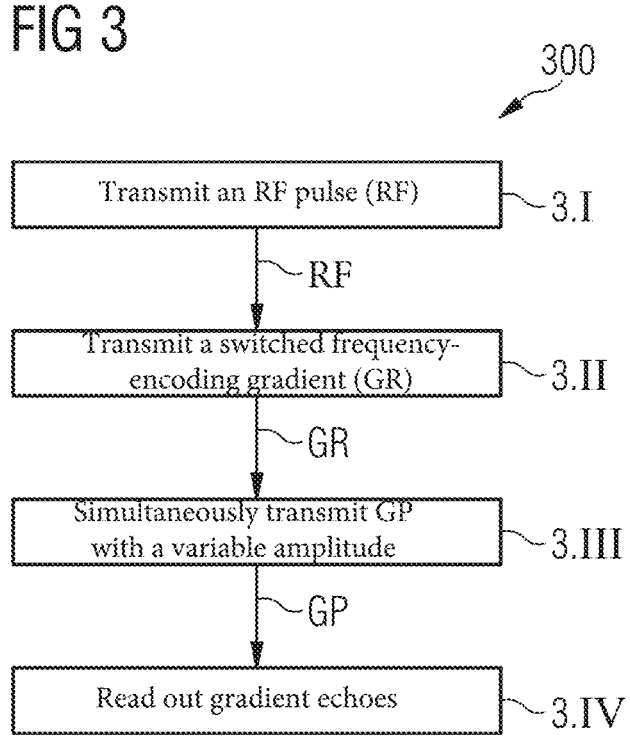
FIG. 3 illustrates an example flow chart of an EPI magnetic resonance imaging method combined with a variable-density undersampling scheme according to an embodiment of the disclosure.

FIG. 3 shows a flow chart 300 of an EPI magnetic resonance imaging method combined with a variable-density undersampling scheme according to an embodiment of the disclosure.

In step 3.I, an RF-pulse RF is transmitted. In step 3.II, a switched frequency-encoding read out gradient GR is transmitted in a variable time interval, and in step 3.III, simultaneously an intermittently blipped low-magnitude phase-encoding gradient GP is transmitted with a variable amplitude such that the k-space is at least partially undersampled; and the time interval of one read out gradient GR is varied depending on the value of the integral of the phase encoding gradient GP. The time interval of one read out gradient GR is varied such that a ratio between the variable time interval of the read out gradient GR and the value of the integral of the corresponding phase encoding gradient GP is maintained above or at a predetermined constant value, which is related to a predetermined criteria of image quality. In step 3.IV, gradient echoes are read out.

Figure 4:
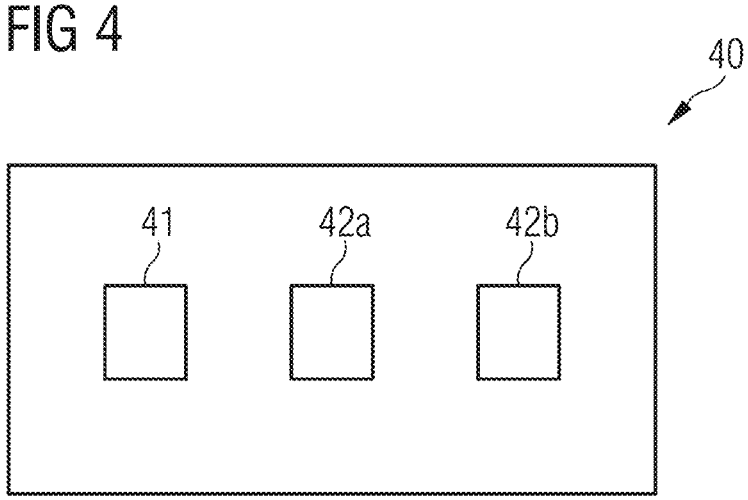
FIG. 4 illustrates an example schematic view on an MR control sequence determination device according to an embodiment of the disclosure.

In FIG. 4, a schematic view on an MR control sequence determination device 40 according to an embodiment of the disclosure is shown.

The MR control sequence determination device 40 comprises an RF-pulse generating unit 41 (e.g. an RF pulse generator) for generating an RF-pulse. Further, the MR control sequence determination device 40 also comprises a phase encoding gradient generating unit 42a (e.g. a phase encoding gradient generator) for generating a phase encoding pulse sequence GP and a read out gradient generating unit 42b (e.g. a read out gradient generator) for generating read out pulse sequence GR.

The read out gradient generating unit 42b generates a switched frequency-encoding read out gradient in a variable time interval and the phase encoding gradient generating unit 42a simultaneously generates an intermittently blipped low-magnitude phase-encoding gradient GP with a variable amplitude A such that the k-space is at least partially undersampled and the time interval EST of one read out gradient GR is varied depending on the value of the integral of the phase encoding gradient GP such that a ratio between the variable time interval EST of the read out gradient GR and the value of the integral of the corresponding phase encoding gradient GP is maintained above or at a predetermined constant value, which is related to a predetermined criteria of image quality.

Figure 5:
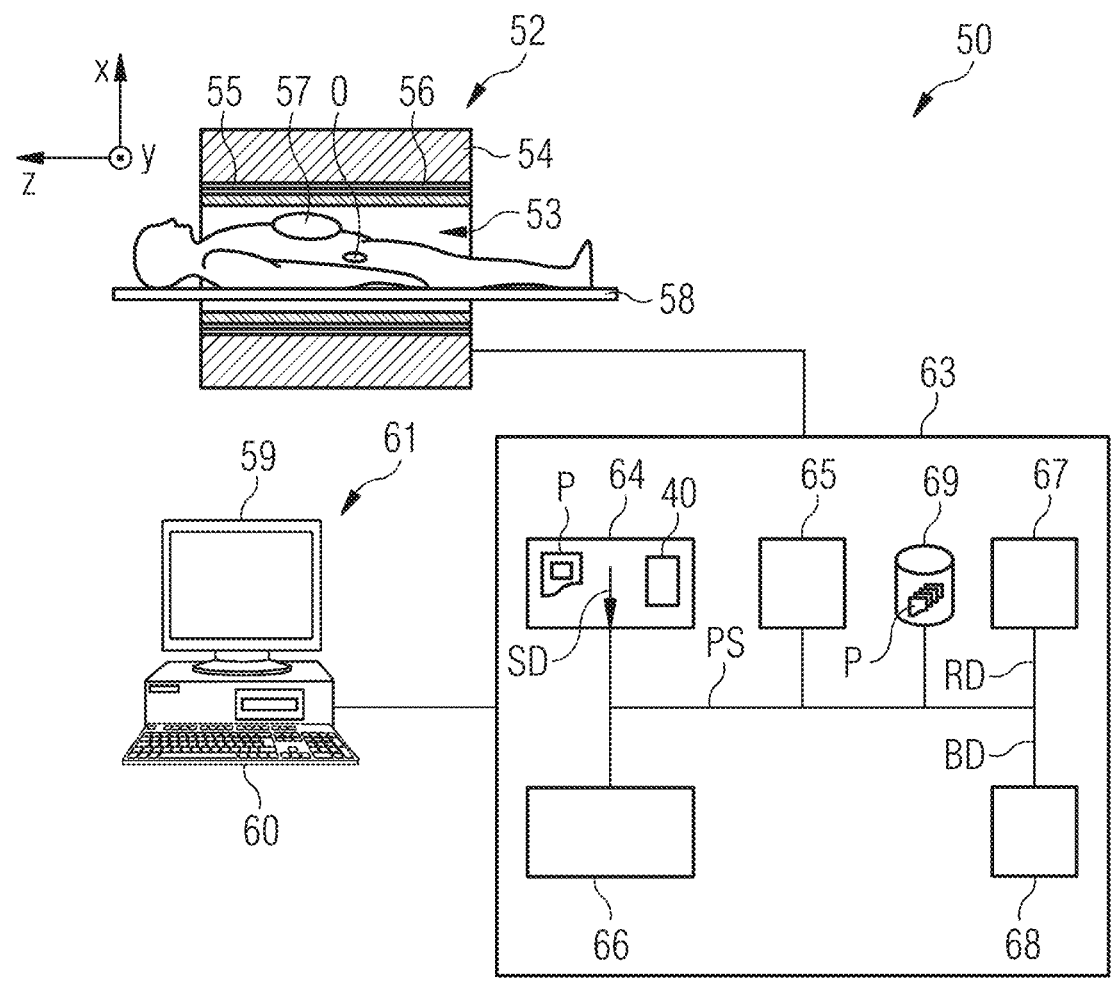
FIG. 5 illustrates an example schematic view of an MR imaging system according to an embodiment of the disclosure.

In FIG. 5, a magnetic resonance system 50 according to an embodiment of the disclosure (hereinafter referred to as "MR system" for short) is schematically shown. On the one hand, it comprises the actual magnetic resonance scanner 52 with an examination room 53 or patient tunnel, into which a patient O, or here a patient or test subject, in whose body there is, for example, a certain organ to be imaged, can be inserted on a couch 58.

The magnetic resonance scanner 52 is equipped in the usual way with a basic field magnet system 54, a gradient system 56, and an RF transmission antenna system 55 and an RF reception antenna system 57. In the exemplary embodiment shown, the RF transmission antenna system 55 is a whole-body coil permanently installed in the magnetic resonance scanner 52, whereas the RF reception antenna system 57 consists of local coils to be arranged on the patient or test person (in FIG. 5 only by a single local coil symbolized). In principle, however, the whole-body coil 55 can also be used as an RF receiving antenna system and the local coils 57 as an RF transmitting antenna system, provided that these coils can each be switched to different modes of operation.

The MR system 50 also has a central control device 63 (e.g. a central controller), which is used to control the MR system 50. This central control device 63 comprises a sequence control unit 64 (e.g. a sequence controller) for pulse sequence control. This is used to control the time sequence of high-frequency pulses (RF pulses) and gradient pulses GR, GP as a function of a selected imaging sequence PS. Such an imaging sequence can be specified within a measurement or control protocol P, for example. Different control protocols P for different measurements may be stored in a memory 69 and can be selected by an operator (and changed if necessary) and then used to carry out the measurement. The sequence control unit 64 also includes a control sequence determination device 40 (e.g. a control sequence determiner) according to the disclosure, which has the structure shown in FIG. 4. The control sequence determination device 40 generates control data SD, which enable a sequence of excitation modules and readout modules, which the sequence control unit 64 outputs for pulse sequence control.

To output the individual RF pulses, the central control device 63 has an RF transmission device 65 (e.g. an RF transmitter), which generates the RF pulses, amplifies them and feeds them into the RF transmission antenna system 55 via a suitable interface (not shown in detail). To control the gradient coils of the gradient system 56, the central control device 63 has a gradient system interface 66. The sequence control unit 64 communicates in a suitable manner, e.g. by sending out sequence control data SD, with the high-frequency transmission device 65 and the gradient system interface 66 for sending out the pulse sequences PS in the order generated by the control sequence determination device 40. The control device 63 also has an RF frequency receiving device (e.g. an RF receiver) 67 (likewise communicating with the sequence control unit 64 in a suitable manner) to coordinately acquire magnetic resonance signals received by the RF transmission antenna system 57. A reconstruction unit 68 (e.g. a reconstructor) accepts the acquired data after demodulation and digitization as raw data RD and reconstructs the MR image data therefrom. The image data BD can then be stored in a memory 69, for example.

The central control device 63 can be operated via a terminal 61 with an input unit 60 and a display unit 59, via which the entire MR system 50 can thus also be operated by an operator. MR images can also be displayed on the display unit 59 and measurements can be planned and started by means of the input unit 60, possibly in combination with the display unit 59, and in particular suitable control protocols with suitable measurement sequences can be selected as explained above and modified if necessary.

The MR system 50 according to the disclosure and e.g. the central control device 63 can also have a large number of further components that are not shown in detail here, but are usually present on such devices, such as a network interface to connect the entire system to a network and to be able to exchange raw data RD and/or image data BD or parameter cards, but also other data, such as patient-relevant data or control protocols.

How suitable raw data RD can be acquired by irradiating RF/HF pulses and generating gradient fields and how MR images BD can be reconstructed therefrom is known in principle to the person skilled in the art and is not explained in more detail here. Likewise, a wide variety of measurement sequences, such as different EPI sequences, for generating dynamic or static images, are fundamentally known to the person skilled in the art.

Figure 6:
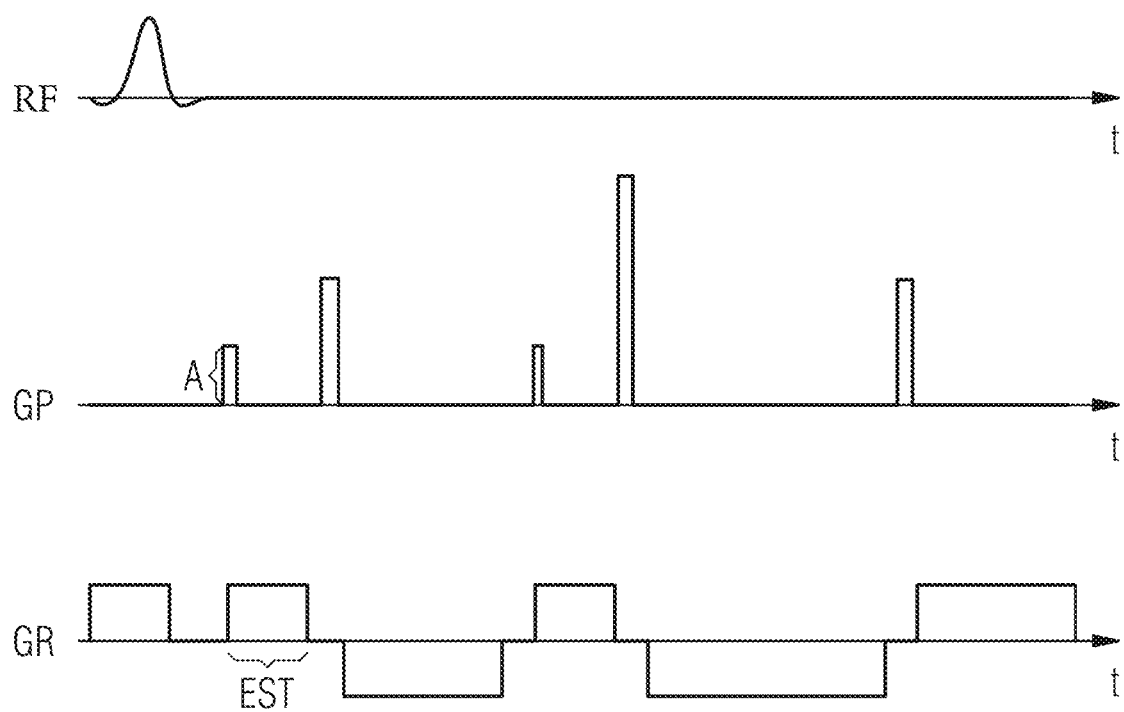
FIG. 6 illustrates an example pulse sequence diagram of an EPI pulse sequence combined with Compressed Sensing (CS)

In FIG. 6, a pulse sequence diagram of an EPI pulse sequence combined with Compressed Sensing (CS) is illustrated. In the upper line, a RF-pulse RF depending on the time is shown, which is transmitted in combination with a readout pulse GR, which is shown in the third line. A first echo is generated by transmitting a blipped phase encoding gradient GP with a first low amplitude A, which is shown in the second line, and after that a read out gradient GR with a short echo spacing time, which is proportional to the low amplitude of the phase encoding gradient GP is generated. Next, a blipped phase encoding gradient GP with an amplitude, which is two times as high as the first amplitude of a blipped phase encoding gradient GP, is transmitted. Then, a read out gradient GR is transmitted with a longer echo spacing time, which is proportional to the amplitude or to the value of the integral of the assigned phase encoding gradient GP.

Next, a blipped phase encoding gradient GP is transmitted with a low amplitude, and after that a read out gradient GR is transmitted with a short echo spacing time EST. Next, a blipped phase encoding gradient GP is transmitted with a high amplitude, which is three times as high as the low amplitude of the preceding blipped phase encoding gradient GP and after that, a corresponding readout gradient GR is transmitted with a long echo spacing time EST, which is three times as long as the echo spacing time EST of the preceding read out gradient GR. At last, a blipped phase encoding gradient GP is transmitted, which is two times as high as a low amplitude phase encoding gradient GP and a corresponding readout gradient GR is transmitted, which is two times as long as a short read out gradient GR. Hence, the effective echo spacing, which is the ratio between the amplitude or the value of the integral of a phase encoding gradient GP and the echo spacing time EST of the following read out gradient GR, is constant. A constant effective echo spacing results in a predetermined image quality.

Figure 7:
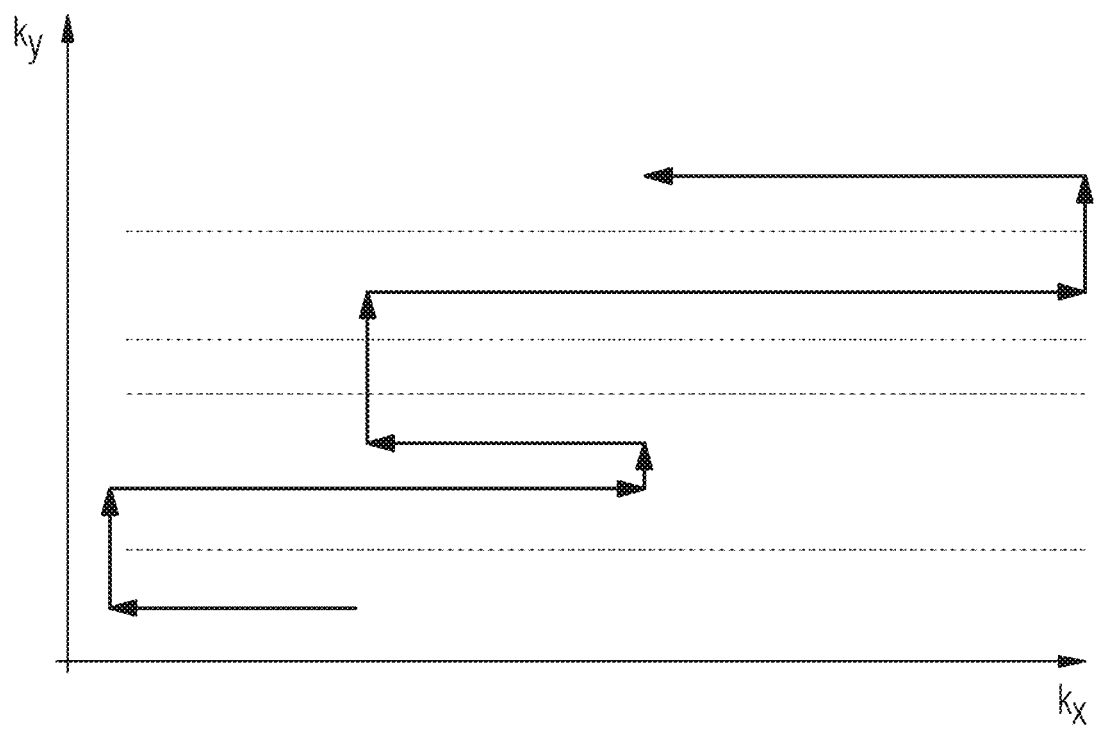
FIG. 7 illustrates an example k-space trajectory corresponding to the pulse sequence illustrated in FIG. 6.

In FIG. 7, a k-space trajectory corresponding to the pulse sequence shown in FIG. 6 is illustrated. As can be taken from FIG. 7, an undersampling is realized by leaving out (i.e. not sampling) the dashed lines of k-space. Further, the length of a portion of the k-space trajectory in ky direction, i.e. in phase encoding direction is proportional to the length of the following portion of the k-space trajectory in kx-direction. Since the undersampling varies, also the length of the trajectory in kx-direction varies such that the ratio between the length of a portion of the trajectory in kx-direction and the preceding portion of the trajectory in ky-direction is constant. This results in a constant effective echo spacing. It is noted that the effective echo spacing may also be higher than a predetermined constant, such that a quality of an image is higher than a minimum requirement. Indeed, a higher effective echo spacing leads to a longer echo spacing time or a reduced undersampling factor, which means that an imaging process needs more time and/or an acquisition a higher amount of raw data.

Finally, it is pointed out once again that the methods and devices described in detail above are only exemplary embodiments, which can be modified in various ways by the person skilled in the art without departing from the scope of the disclosure. Furthermore, the use of the indefinite article "a" or "an" does not exclude the possibility of the relevant characteristics appearing more than once. Likewise, the term "unit" does not exclude the fact that the relevant component consists of several interacting sub-components, which may also be spatially distributed.

The various components described herein may be referred to as "devices" or "units." As noted above, such components may be implemented via any suitable combination of hardware and/or software components as applicable and/or known to achieve the intended respective functionality. This may include mechanical and/or electrical components, processors, processing circuitry, or other suitable hardware components configured to execute instructions or computer programs that are stored on a suitable computer readable medium. Regardless of the particular implementation, such devices and units, as applicable and relevant, may alternatively be referred to herein as "circuitry," "processors," or "processing circuitry."

What is claimed is:

1. An Echo-Planar-Imaging (EPI) magnetic resonance imaging (MRI) method combined with a variable-density undersampling scheme, comprising:
   generating a radio frequency (RF) pulse;
   applying a switched frequency-encoding read out gradient in a variable time interval; and
   applying simultaneously an intermittently blipped low-magnitude phase-encoding gradient with a variable value of an integral of the intermittently blipped low-magnitude phase-encoding gradient, such that k-space is at least partially undersampled,
   wherein a time interval of the switched frequency-encoding read out gradient is varied depending on a value of the integral of the intermittently blipped low-magnitude phase-encoding gradient such that a ratio between (i) the variable time interval of the switched frequency-encoding read out gradient, and (ii) the value of the integral of the corresponding intermittently blipped low-magnitude phase-encoding gradient is maintained above or at a predetermined value, and
   wherein the predetermined value is based upon a predetermined criteria of image quality.

2. The method according to claim 1, wherein:
   an amplitude of the intermittently blipped low-magnitude phase-encoding gradient is variable, and
   a time interval of the switched frequency-encoding read out gradient is varied further depending on the amplitude of the intermittently blipped low-magnitude phase-encoding gradient such that a ratio between (i) the variable time interval of the switched frequency-encoding read out gradient, and (ii) the amplitude of the corresponding intermittently blipped low-magnitude phase-encoding gradient is maintained above or at the predetermined value.

3. The method according to claim 1, wherein the ratio between (i) the variable time interval of the switched frequency-encoding read out gradient, and (ii) the integral of the corresponding intermittently blipped low-magnitude phase-encoding gradient is maintained throughout an entire sampling of k-space above or at the predetermined value.

4. The method according to claim 2, wherein the ratio between (i) the variable time interval of the switched frequency-encoding read out gradient, and (ii) the amplitude of the corresponding intermittently blipped low-magnitude phase-encoding gradient, is maintained throughout an entire sampling of k-space above or at the predetermined value.

5. The method according to claim 1, wherein the variable-density undersampling scheme comprises a variable density along a phase-encoding direction, which is used for acquiring raw data for image reconstruction based on a parallel imaging scheme.

6. The method according to claim 1, wherein the variable-density undersampling scheme comprises a variable density along a phase-encoding direction, which is used for acquiring raw data for an image reconstruction based on a compressed sensing scheme.

7. The method according to claim 1, wherein the EPI magnetic resonance imaging method is used as part of a functional MRI (fMRI) technique.

8. The method according to claim 1, wherein the EPI magnetic resonance imaging method is used as part of a diffusion-weighted MRI technique.

9. A magnetic resonance (MR) control sequence determination device, comprising:
a radio frequency (RF)-pulse generator configured to generate an RF pulse; and
a gradient generator configured to:
generate a switched frequency-encoding read out gradient in a variable time interval; and
simultaneously generate an intermittently blipped low-magnitude phase-encoding gradient with a variable value of an integral of the intermittently blipped low-magnitude phase-encoding gradient, such that k-space is at least partially undersampled,
wherein the time interval of the switched frequency-encoding read out gradient is varied depending on a value of the integral of the intermittently blipped low-magnitude phase-encoding gradient such that a ratio between (i) the variable time interval of the switched frequency-encoding read out gradient, and (ii) the value of the integral of the corresponding intermittently blipped low-magnitude phase-encoding gradient is maintained above or at a predetermined value, and
wherein the predetermined value is based upon a predetermined criteria of image quality.

10. The MR control sequence determination device of claim 9, wherein the MR control sequence determination device is part of a magnetic resonance imaging (MRI) system comprising a scanner.

11. A non-transitory computer-readable medium having instructions stored thereon that, when executed by a controller of a magnetic resonance imaging (MRI) system, cause the MRI system to:
generate an RF pulse;
generate a switched frequency-encoding read out gradient in a variable time interval; and
simultaneously generate an intermittently blipped low-magnitude phase-encoding gradient with a variable value of an integral of the intermittently blipped low-magnitude phase-encoding gradient, such that k-space is at least partially undersampled,
wherein the time interval of the switched frequency-encoding read out gradient is varied depending on a value of the integral of the intermittently blipped low-magnitude phase-encoding gradient such that a ratio between (i) the variable time interval of the switched frequency-encoding read out gradient, and (ii) the value of the integral of the corresponding intermittently blipped low-magnitude phase-encoding gradient is maintained above or at a predetermined value, and
wherein the predetermined value is based upon a predetermined criteria of image quality.

* * * * *